United States Patent [19]
Cox et al.

[11] Patent Number: 5,227,983
[45] Date of Patent: Jul. 13, 1993

[54] METHOD AND APPARATUS FOR DESIGNING A DISTRIBUTION SYSTEM FOR A BUILDING

[75] Inventors: Gene M. Cox, Lisle; Charles L. Hines, III, Hinsdale; Linda M. Normann, Glendale Heights, all of Ill.

[73] Assignee: First Graphics, Inc., Downers Grove, Ill.

[21] Appl. No.: 989,478

[22] Filed: Dec. 7, 1992

Related U.S. Application Data

[63] Continuation of Ser. No. 551,919, Jul. 20, 1990, abandoned.

[51] Int. Cl.$^5$ .............................................. G06F 15/46
[52] U.S. Cl. .................................. 364/512; 364/578; 364/488; 434/72
[58] Field of Search ............ 364/512, 578, 505, 226.7, 364/917.96, 488; 434/72, 428, 75, 79

[56] References Cited

U.S. PATENT DOCUMENTS

| | | | |
|---|---|---|---|
| 3,867,616 | 2/1975 | Korelitz et al. | 364/512 |
| 4,181,954 | 1/1980 | Rosenthal et al. | 364/520 |
| 4,353,117 | 10/1982 | Spellman | 364/512 X |
| 4,512,747 | 4/1985 | Hitchens et al. | 434/428 |
| 4,551,810 | 11/1985 | Levine | 364/512 X |
| 4,700,317 | 10/1987 | Watanabe et al. | 364/488 |
| 4,789,944 | 12/1988 | Wada et al. | 364/488 |
| 4,831,546 | 5/1989 | Mitsuta et al. | 364/512 |
| 4,847,778 | 7/1989 | Daley | 364/474.22 |
| 4,964,060 | 10/1990 | Hartsog | 364/512 |

OTHER PUBLICATIONS

Zhu et al., "A Symbolic Approach to the Fast Design of Industrial Piping Systems," Proceedings of the SAE/ESD International Computer Graphics Conference, Apr. 7-9, 1987, pp. 69-73.

Tracy, "Facility and Equipment Engineering Quality Assurance Through CAD-A Case History," Proceedings of the SAE/ESD International Computer Graphics Conference, Apr. 7-9, 1987, pp. 53-62.

Primary Examiner—Thomas G. Black
Assistant Examiner—Collin W. Park
Attorney, Agent, or Firm—Olson & Hierl, Ltd.

[57] ABSTRACT

A method and apparatus for designing a distribution system for a building is disclosed. Elements of such distribution systems and requirements of relevant standard, are stored in a computer's memory. Building parameters are entered into a computer manually. The user selects the standard to be followed and the element to be optimized. The system divides the building into sections as appropriate to the user selected standard. The system then computes layout needed to comply with the selected standard. The layout is routed and sized to avoid building structural members, yet the elements of the layout are optimized for size and length. The apparatus prints out a hard copy of the design layout which can include an elements listing needed to complete the system.

48 Claims, 10 Drawing Sheets

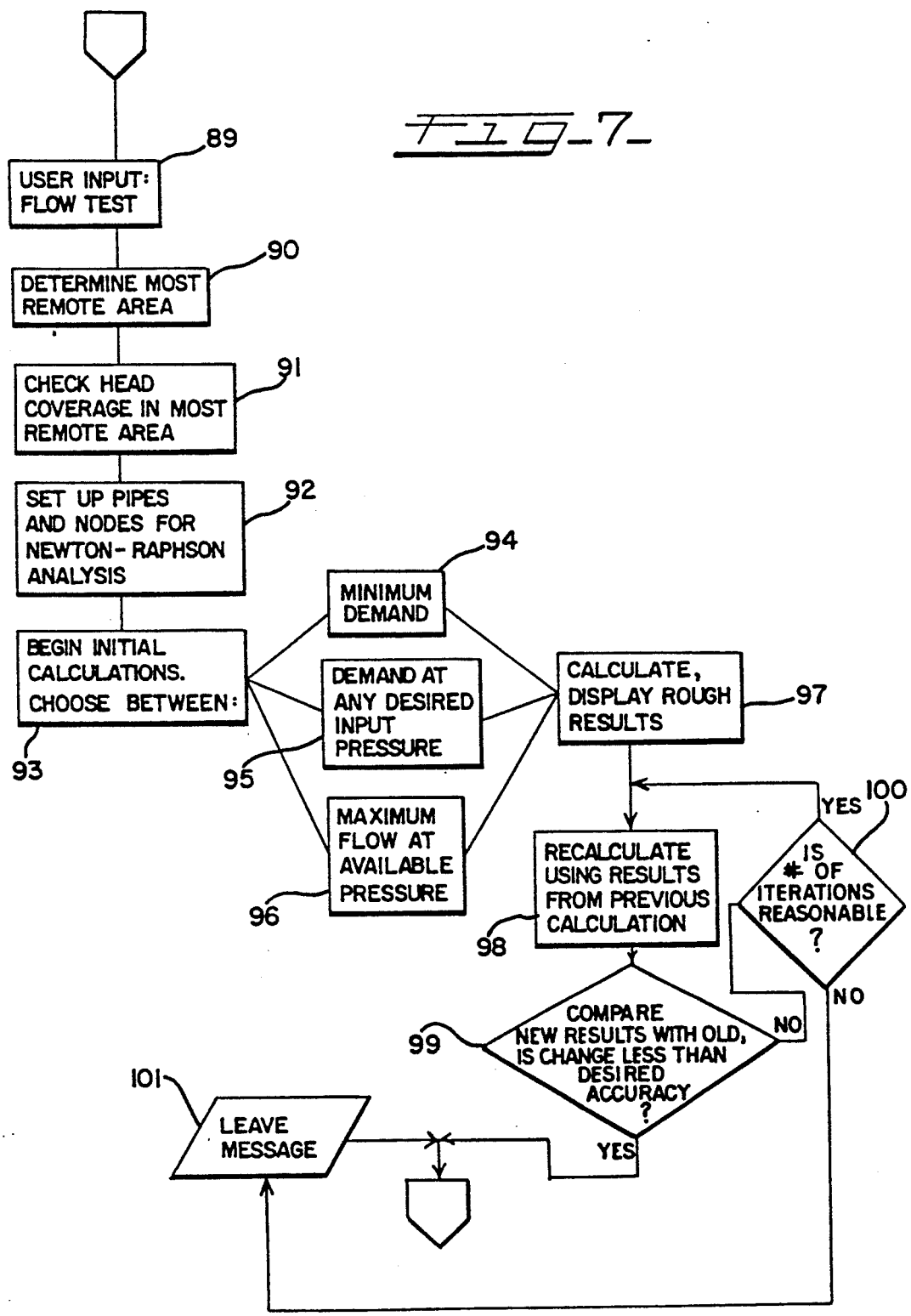

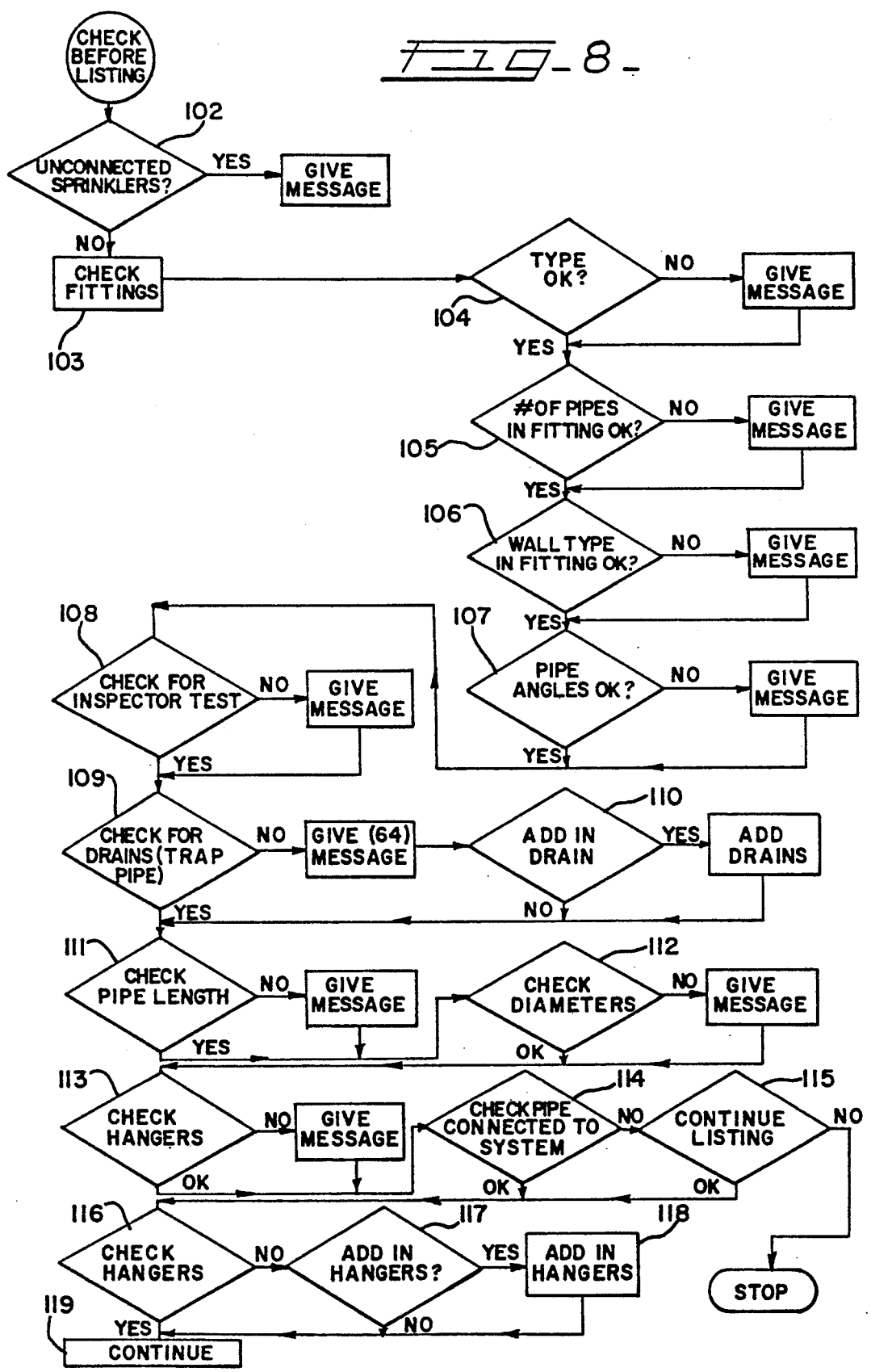
FIG_8

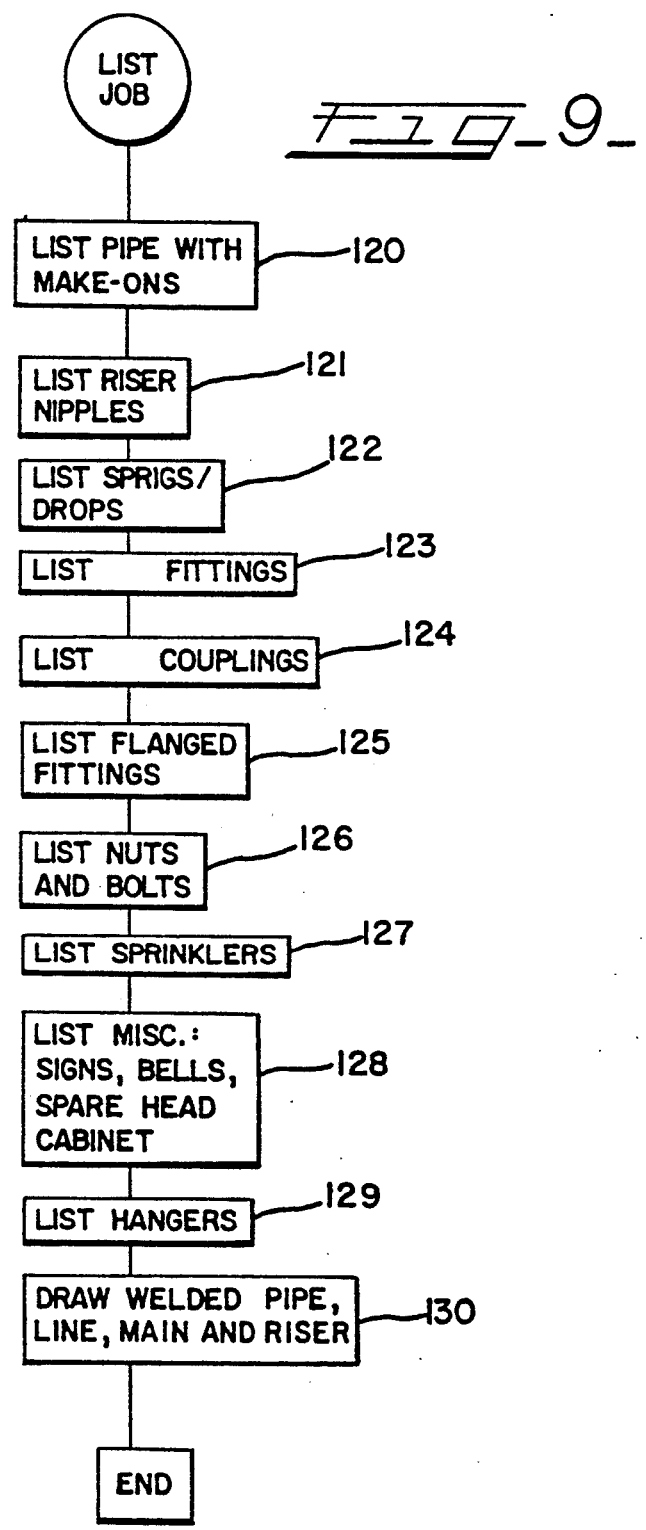

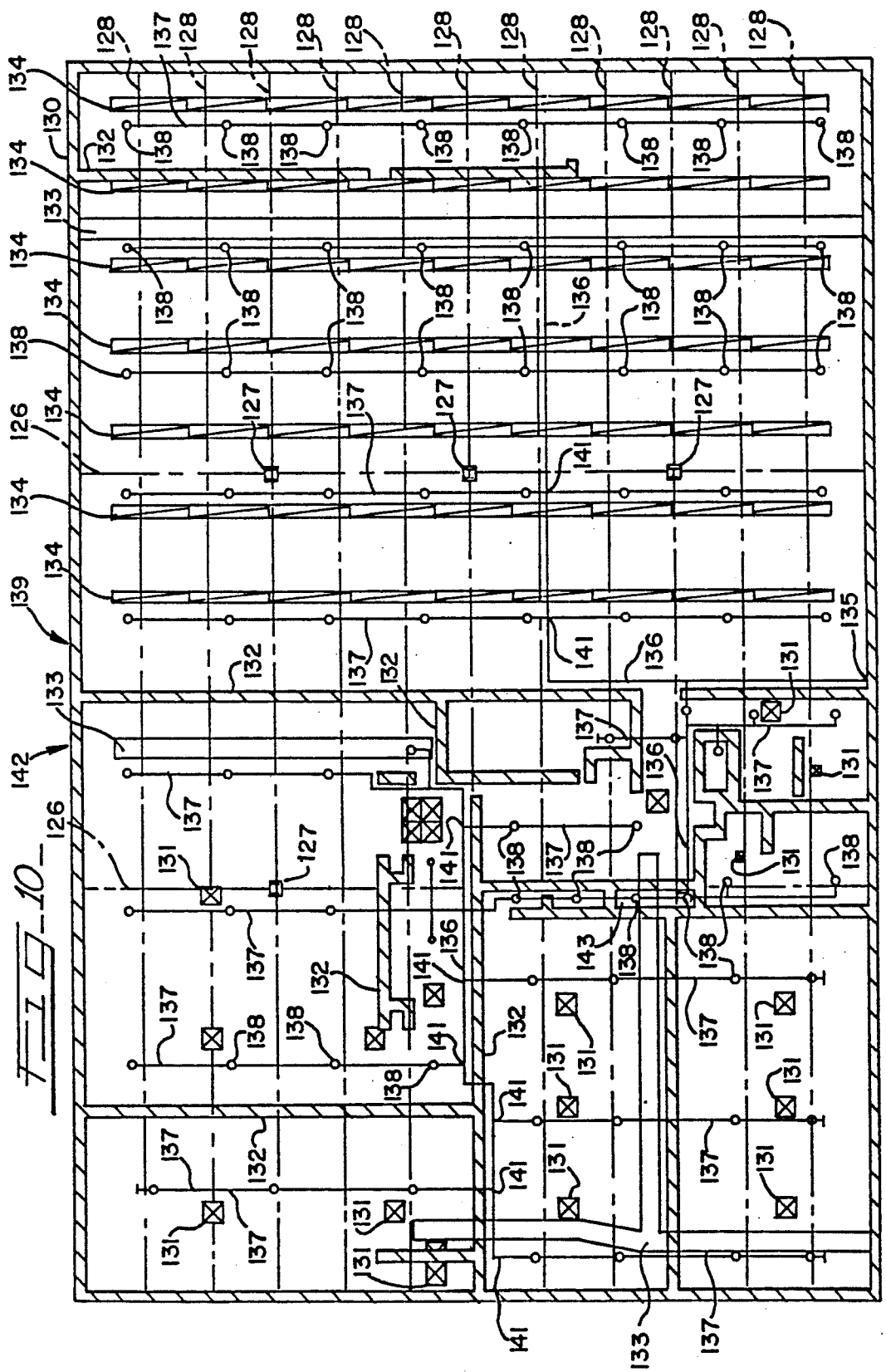

METHOD AND APPARATUS FOR DESIGNING A DISTRIBUTION SYSTEM FOR A BUILDING

This application is a continuation of application Ser. No. 07/551,919, filed Jul. 20, 1990, now abandoned.

TECHNICAL FIELD

This invention relates to a method and apparatus for designing a distribution system for a building and, in particular, to an automated system for designing the distribution system.

BACKGROUND OF THE INVENTION

Distribution systems are found in every building. Such distribution systems provide for the movement and channelling of gases, liquids and electricity through a building. In any building, there are one or more distribution systems including a sprinkler system, duct work for heating, ventilation and air conditioning, plumbing and electrical systems.

One major type of distribution system is a sprinkler system for fire containment which is found in many buildings today. In today's society, any building where people congregate to live, work or play such as office buildings, factories, hotels, motels, apartment buildings, condominiums or shopping malls likely will include a sprinkler system to protect the public from a fire catastrophe.

Governmental bodies have recognized the need to protect against catastrophic fires by legislating standards for sprinkler systems into their building codes. Also, insurance companies, fearful of the potential liability of a catastrophic fire, have often demanded sprinkler systems in buildings as a condition for insurance coverage.

A building will have to comply with one or more standards for any distribution system. First, any building will need to comply with the standards set forth in relevant governmental codes. Often, insurance companies will require compliance with standards which may be tougher than the relevant governmental code. These standards can be set by the industry itself such as the National Fire Protection Association (NFPA) guidelines or the standards may be set by an insurance company directly.

A design for a sprinkler system must take into account many factors. The primary concern is ensuring adequate containment in the event of a fire. Thus, the spacing as well as the available water volume and water pressure at the sprinkler heads must be considered. Consideration must be given to the occupancy use to be made of a building. A chemical factory utilizing flammable solvents will require a different sprinkler system than a shopping mall.

In addition, there are many engineering or architectural constraints placed on sprinkler system design. For example, if interconnected sprinkler lines do not lie in a horizontal plane, drains must be inserted to allow water flow to prevent freezing. This is particularly true in the case of a dry sprinkler system which must not contain water except during actual use.

The sprinkler system must be designed with other building elements and adjuncts in mind. Locations must be found to hang the sprinkler system. Manually determining paths which avoid these obstructions, where to support the sprinkler system, how to allow each line to lie in a plane yet providing an adequate water supply which meets all requirements is difficult, tedious and very time consuming.

The concerns expressed above for a sprinkler system also relate to heating, ventilation and air conditioning (hereafter "HVAC"), plumbing and electrical systems. Standards also must be complied with when designing these systems for a building. The proper amount of light, ventilation and heat must be provided for each area.

The problem is compounded when, as usual, the various distribution system subcontractors must work out between themselves where to position the electrical conduits, the HVAC duct work, the plumbing piping and the sprinkler system. Generally, an architect or a general contractor designs the building elements such as beams, walls and joists. Left for the subcontractors is usually a space near the top of the steel. Into this space must go the various building adjuncts such as electrical conduit, overhead lighting fixtures, HVAC duct work and sprinklers. It is left to the subcontractors among themselves to specifically locate each such adjunct system.

Still another concern is keeping the cost of the system reasonable without sacrificing system performance. Designing a system which utilizes material in the most cost efficient manner is very difficult. For example, piping comes in standard lengths which are then cut to size as needed. Two sometimes conflicting concerns are (1) minimizing labor costs by minimizing the number of cuts and (2) reducing the left-over scrap material. Balancing these concerns is not a trivial exercise for an engineer.

In addition, the engineer must design a system which provides adequate HVAC to all parts of a building given the varying conditions different portions of a building may encounter. For example, the HVAC requirements for the sunless north side of a building will differ from the full sun south side or the half day sun of the east and west sides. As is apparent, designing a distribution system manually is an onerous task. There is a need for a system which automatically performs these tasks.

What is needed is a system which coordinates the layouts of all the various distribution systems needed for a building. Such a system should provide for efficient design of the system, not only for its operation, but also its installation and cost.

The system should also provide hard copy or design for use in constructing the designed system. This hard copy can be used by people installing the electrical or sprinkler system at the construction site. It would also be useful if the system would provide a complete listing of the elements needed to install the distribution system.

The present invention meets these desires.

SUMMARY OF THE INVENTION

The invention is a method and apparatus for designing a distribution system for a building. The distribution system can be any system used in a building including plumbing, electrical, sprinkling, ventilating and related systems or any combination of such systems. Information about the distribution system elements and various standard requirements is stored into a memory of a computer. Information about the building elements and adjuncts including location of walls and similar obstructions are entered into a computer. These building elements and adjuncts are then stored in the memory of the computer. The user also selects the particular standard which is applicable to the building being constructed. For example, this may be a particular standard for lighting systems or a particular fire code used to design a sprinkler system.

A computer program then divides the building into suitable floors and then each floor into sections. Sections most often are either bays which are defined by the location of the beams of the building or individual rooms defined by the walls. This division breaks the problem down into manageable proportions.

The computer program then computes the layout needed for the distribution system based upon the selected standard. For example, how much light or ventilation is needed in a particular room. The layout is routed as economically as possible while avoiding the building elements and adjuncts. In addition, the quantity and location of hangers needed to support the distribution system as well as other special fittings needed are calculated. These computations are repeated for each section.

After the computations are complete, the program stores the information in memory and then can print out hard copy of the layout of the system. Also, a elements listing showing the number of components can be printed. For example, this will list how many and what type of light fixtures and wire are needed or, in the case of a sprinkler system, how many and what types of sprinkler heads and pipes are needed. Lastly, the most economical plan for cutting elements (e.g. pipes) to size is devised and printed.

BRIEF DESCRIPTION OF THE DRAWINGS

In the accompanying drawings, which form a portion of this disclosure:

FIGS. 1 through 9 in combined form represent a flowchart of the computer program used in generating the present invention.

FIG. 10 is a diagram of a sprinkler system for combined warehouse and office space designed by the present invention.

DESCRIPTION OF THE PREFERRED EMBODIMENTS

Figure 1:
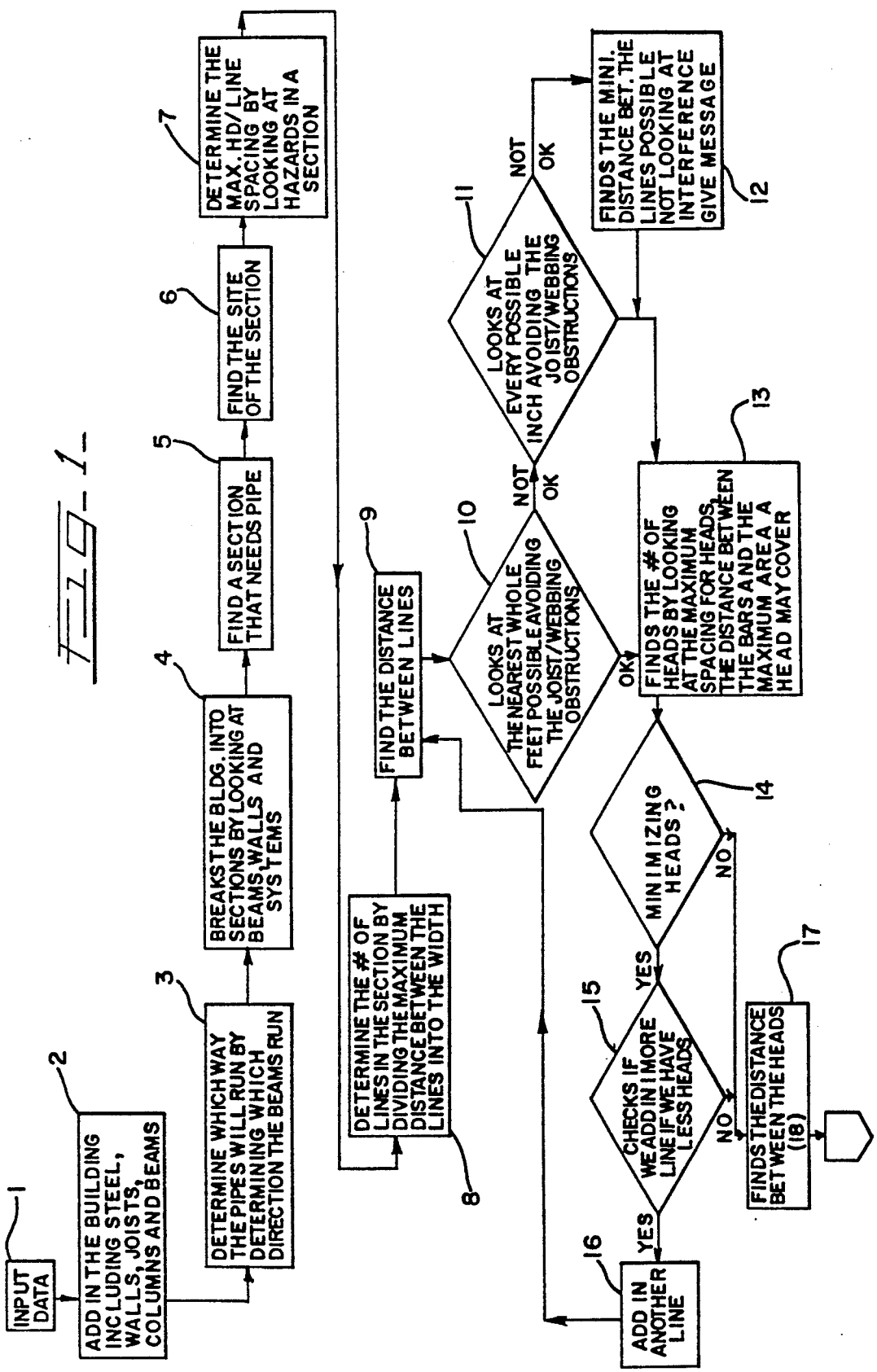

A computer system for use in the design of distribution systems preferably consists of a CRT display and a keyboard-type input operatively connected to a computer. The computer is preferably operatively linked to a plotter, a printer and disk type storage units. For ease of description, the example of a sprinkler system is given, however, many of the same elements apply to other distribution systems. A sprinkler system is generally the most complicated and accordingly serves as a good example.

As described in detail later, elements of a distribution system are first stored on the disk type storage units. For a sprinkler system, the elements include information regarding all standard sprinkler heads, piping, fittings, hangers, drains including physical dimensions and fluid flow capacities.

Also stored on the disk type storage units are the requirements of relevant standards. The requirements can include the number, type, separation and water supply for sprinkler heads demanded by a particular governmental body or an insurance company.

A building designer or architect enters into the computer data regarding the building elements and adjuncts of buildings. The entry of the data may be accomplished though a number of methods. Examples include directly through the keyboard, floppy disk or modem. The building elements and adjuncts will include, among others, the dimensions and locations of the water stub-in, beams, columns, walls, ceilings, floors, girders, joists and electrical equipment. The building designer or architect also selects a standard to which the building must comply. Lastly, the designer chooses the elements to be optimized when constructing a building. For a sprinkler system, the designer generally will select either lines or sprinkler heads for optimization. For purposes of orientation, the lines will generally be parallel to the beams.

The computer program preferably treats each floor of a multistory structure as a separate building. The computer program provides two options for dividing the floors. In the first method, each floor is divided into sections which are oriented horizontally and are defined by the location of the beams. Generally, though not always, this method is utilized for large, open floor plan buildings such as warehouses. In the second option, the building is divided into individual rooms as per the floor plan. This method is generally used for office buildings and the like. Both methods may be used in one structure. As seen in FIG. 10, one example of mixed use is a warehouse wherein the main storage area may be divided by the first method, but the office area may be done by the second method. Whatever the method, as hereinafter used, the term "section" refers to bays as in option one or rooms as in option two.

The computer program selects a section to begin its analysis. The first step is the determination of the number and location of the lines. The width of the selected section is divided by a maximum distance between lines permitted in the user selected standard.

The resulting number is rounded up to a next highest whole number, this whole number being the number of lines for this section. The number of lines is then also divided into the width of the section. The result of this division is the minimum distance between lines. Note that the minimum distance between lines may equal the maximum distance between lines if the width of the section divided by the maximum distance between lines is a whole number.

The placement of a first line from the first lengthwise wall is computed by dividing the minimum distance between lines by two. The first line is then located parallel to the first lengthwise wall at the placement distance.

The computer electronically checks the location by running an obstruction analysis which compares the location of the first line with the building elements and adjuncts input data to determine if there is a conflict. If there is a conflict, the first line will be relocated an incremental distance away from the first lengthwise wall and the computer reruns the obstruction analysis. The relocation-obstruction analysis cycle is repeated until either the separation between the first line and the first lengthwise wall exceeds one half the maximum distance between lines or an obstruction free path is found.

Preferably, the incremental distance chosen initially is one foot (30 cm.). If an obstruction free path is not found before one-half the maximum distance is reached, the program repeats the cycle using an incremental distance of one inch. If an obstruction free path is still not found, the computer notifies the user and manual editing may be required to either relocate the elements of the section, the line or adding more lines to allow complete coverage.

If an obstruction free path is found, then the computer moves on to locating a subsequent line. The placement distance for subsequent lines is the minimum distance between lines. Any subsequent line is also located parallel to the beams.

Again, the computer repeats the obstruction analysis for the subsequent line. If a conflict is found, the subsequent line will be relocated the incremental distance from the first or preceding line until either the separation between the first or preceding line exceeds the maximum distance between lines or else no obstruction is found.

Preferably, the incremental distance is initially one foot (30 cm.) with a second pass at one inch (2.5 cm.) if no obstruction free path is located on the first pass. Again, preferably the designer will be notified if neither pass finds an obstruction free path. The subsequent line locating procedure is repeated until the total number of located lines equals the calculated number of lines needed.

The next step is determining the number and location of sprinkler heads needed to comply with the selected standard. The length of the section is first multiplied by the minimum distance between lines to yield the total area heads on a given line must cover. From the selected standard, the computer finds the maximum area a single head is to cover. The total area per line is divided by this maximum area. The result is rounded up to the next whole number which is the number of heads per line.

The minimum distance between heads is determined by selecting the lessor of:

a) dividing the length of the section by the number of heads;

b) dividing the maximum area a head is to cover by the minimum distance between lines; and c) the maximum distance between heads allowed under the selected standard.

The placement distance from the first widthwise wall of a first head is determined by dividing the minimum distance between heads by two. The first head is positioned along the line at the placement distance from the wall.

The computer electronically checks the location of the first head by running an obstruction analysis. The analysis compares the location of the first head with the location input of building elements and adjuncts data to determine if a conflict exists. The obstruction analysis checks not only the head itself, but the projected spray from the head to ensure proper coverage.

If there is a conflict, the first head will be relocated at an incremental distance further from the first widthwise wall. The obstruction analysis is then rerun. The relocation-obstruction analysis cycle is repeated until either an obstruction free area is found or the separation between the first head and the first lengthwise wall exceeds one half the maximum distance between lines.

In this preferred embodiment, the incremental distance chosen initially is one foot (30 cm.). If an obstruction-free path is not found before the one half maximum distance is reached, the program will repeat the cycle using a one inch incremental distance. If an obstruction free path is still not found, the computer notifies the user and manual editing will be required to either relocate building elements and adjuncts or customize a head location.

If an obstruction free path is found, then the computer moves to locating a subsequent head. The procedure is the same as detailed above except for using the minimum and maximum distances between heads instead of one half the minimum and maximum distances between heads. The cycle is repeated until the number of located heads equals the number heads calculated for the line. If that is the case, the computer then moves to a subsequent line and locates the heads on the subsequent line. The cycles continue until all the heads are located for a given section.

The preferred embodiment is as described above. Alternatively, the computer can be programmed to calculate the number and location of heads first and then connect the heads via lines.

The computer program now determines the number of mains needed in a section. Preferably, one main is used if the number of heads per line is seven or less. Two mains are used if the number of heads per lines is greater than seven.

The mains are oriented perpendicular to the lines and in the same plane just below the beams. The main will overlap all the lines preferably by at least six inches on either side.

If only one main is used, the computer divides the number of heads per line by two and truncates, the result to an integer. The main is placed between the head corresponding to the integer value and the head corresponding to the integer value plus one as counted from the first head.

If two mains are used and there are eight or nine heads per line, a first main is located between the first head and the first widthwise wall. A second main is located between the seventh and eighth heads as counted from the first head.

If two mains are used and there are ten or more heads per line, the first main is located between the second and third heads as counted from the first head. The second main is located between the second to last and the third to last main as counted from the first head.

The computer now searches through the stored sprinkler elements to determine the proper fittings to connect the heads to the lines and the lines to the mains. The mains are connected to the water stub-in where the water enters the building. Hangers will be added to support the pipes. An appropriate slope, preferably one half inch in ten feet will be computed. This completes the sprinkler system for the section.

The computer program stores the completed section into the disk storage means. Another section is selected and the process described above repeated until the sprinkler system layout for the entire building is finished and stored.

A hydraulic analysis is performed on the entire system which must be within the limits of the available water supply, including the static pressure, the residual pressure and the residual flow. The appropriate test for the selected standard is chosen. Various factors including the density per area, rules of NFPA 13, Hazan-Williams coefficient and the K factors for the heads to be used in the tests. The largest head coverage area in the most physically remote section is initially selected.

The computer begins a Newton-Raphson analysis which sets up an NxM matrix wherein "N" equals the number of pipes with differing flows or pressures and "M" equals the number of parameters evaluated. Preferably, "M" equals fourteen. These parameters include the pipe length, pipe diameter and "K" factors for the heads or other outlets.

Using the Newton-Raphson matrix, the computer may evaluate:

1) Minimum water pressure needed for the system to function per the selected standard;
2) The flow at any given input pressure; or
3) The flow at the given input pressure.

As an alternative, a Hardy Cross analysis may be performed. In either case, the computer can supply the hydraulic data for any line, main or head in the building. If any problems are detected, manual editing with recalculation is possible. Preferably, at any step through this computer, a user may manually edit lines, mains, heads or the building elements and adjuncts of the building. For example, if an obstruction analysis shows a beam blocking a pipe, then the program will suggest an alternate path which avoids the team.

Once the entire system is completed and checked, hard copy, including blueprints, can be generated to supply the user. Also, a full inventory of fittings, piping, hangers, heads and drains needed is available. As an additional benefit, the computer will optimize the cutting of standard 21, 24 or 25 foot piping lengths or combinations thereof to minimize the time and scrap generated. This alone can result in substantial savings.

Referring to FIGS. 1-9, an alternative embodiment is described. This alternative embodiment is very similar to the embodiment described above. However, there are differences which will be pointed out as they occur.

Referring to FIG. 1, blocks 1 and 2, the user inputs data which includes the steel, walls, joists, columns and beams. Also included is the location of the water stub-in for this particular building. Again, as used herein the term building includes the individual floors of a multi-story structure.

In block 3, the computer next determines which way the pipes are run by determining the direction the beams run. As in the previous embodiment, the lines will run parallel to the beams.

In block 4, the computer breaks the building into sections by looking at the beams, walls and systems as appropriate. The term "sections" as used herein includes both the bay sections which are the open spaces between beams or rooms which are determined by the location of walls. Again, these sections are determined by what use is to be made of the structure.

In block 5, the computer determines which sections have not had a sprinkler system installed with the program. It then selects a section to electronically install the sprinkler system. In the next block, the program determines the location of this particular section within the entire structure.

In block 7, the computer will get data from the user relating to the hazards which a particular section will encounter. This entails a knowledge of the activities which will occur in a particular section. The hazards within a section will determine the maximum head and line spacing as determined by the building standards the user selected.

In block 8, the computer will determine the number of lines in the particular section by dividing the maximum distance between the lines into the width of the section. The width of the section is the direction perpendicular to the beams.

In block 9, the computer determines the distance between lines for this particular section. The computer, in blocks 10 and 11, evaluates possible routes to avoid joists and other obstructions. Block 10 does the evaluations to the nearest foot to avoid these obstructions. If a clear path is not found in block 10, then block 11 evaluates possible paths every inch to seek to avoid the obstructions. If a clear path is not found, the computer simply finds the minimum distance between lines without looking at any possible obstructions or interference as shown in block 12. The computer will give a message to the user that it is doing so.

Once a path is determined, the computer in block 13 will find the number of heads to be placed on the line by looking at the maximum spacing for heads, the distance between the lines and the maximum area a head may cover.

In block 14, the user will input into the computer whether or not the user is minimizing the number of heads or the number of lines in this particular system. If the user is minimizing heads in block 14, the computer will check in block 15 and see if adding an additional line will result in fewer heads.

If adding a line does result in fewer heads, the computer will add an additional line by determining that the number lines in the section is now the original determination plus one and repeat the cycle beginning with block 9. If the user is not minimizing heads or if adding a line does not reduce the number of heads, the computer will calculate the distance between the heads necessary for each line as shown in block 17.

Figure 2:
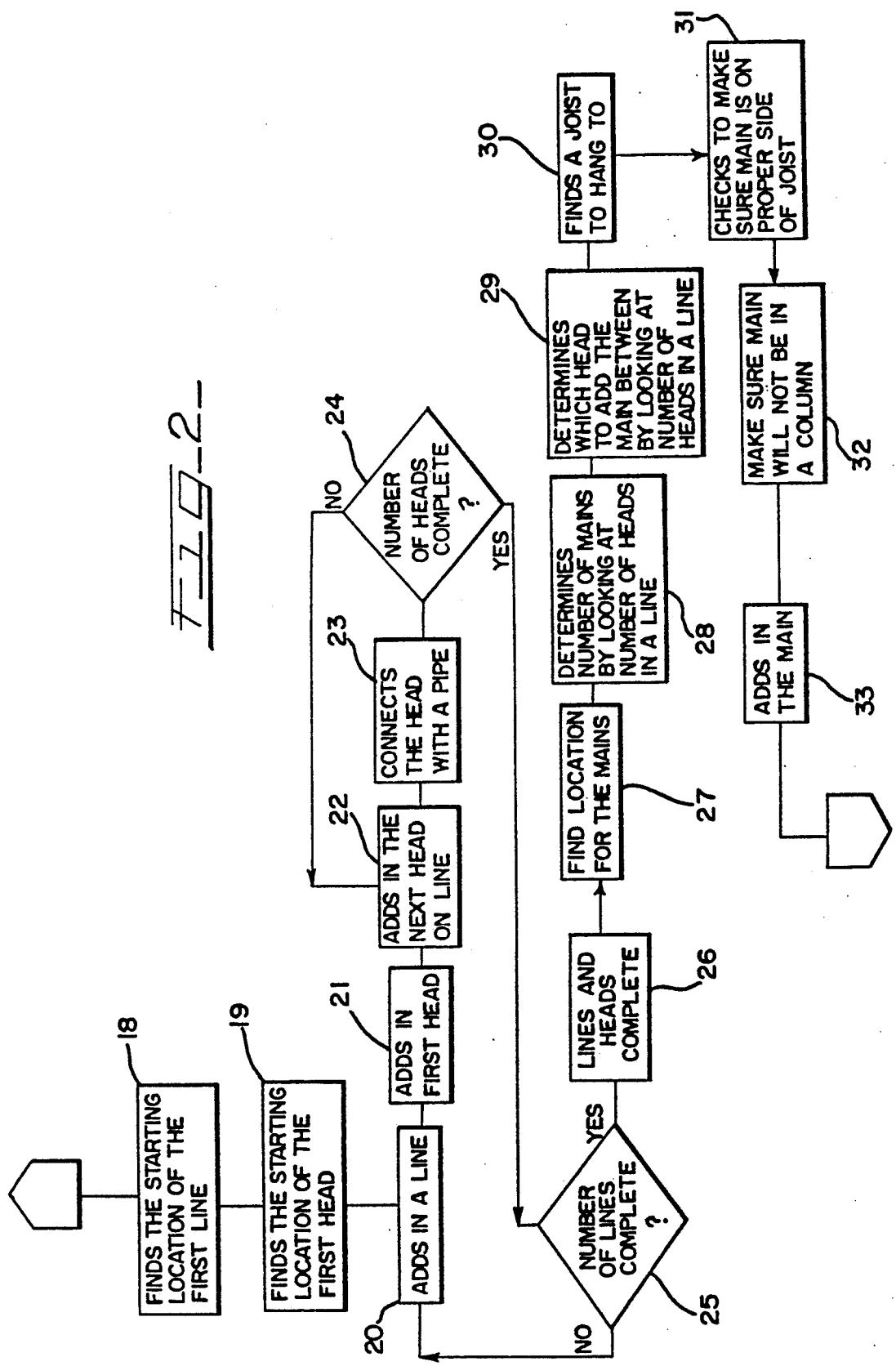

Turning now to FIG. 2, in block 18 the computer determines the starting location of the first line. The method is as described in the earlier embodiment. Once the location is found, in block 19 the computer then determines the starting location of the first head on this line. Note that this contrasts with the earlier described embodiment wherein all the line locations were found before positioning any heads. The computer will store these locations into its memory in block 20.

The computer will continue to add heads onto the line and connect the heads to the pipe as noted in the cycle denoted by blocks 20 through 24 until the number of heads calculated in block 13 are positioned.

The next determination, in block 25, is whether the number of lines calculated in blocks 8 or 16 are located. If the answer is no, then it will add in another line as described above in block 18 and the sequence picks up from there. If the number of lines is complete, then the next step is to move on to determining the location for the mains as noted in block 26. In blocks 27 and 28, the computer determines the location and number of mains. The number of mains is determined by looking at the number of heads on a line as described in the earlier embodiment. It then determines in block 29 where to position the main relative to the heads. The computer finds a joist to support the mains in block 30. Determining which joist to use involves checking that the main is located on the proper side of the selected joist in block 31. If the main is located on the wrong side of the joist, it may have to be relocated as this can make connecting to the lines very difficult.

It also makes sure in block 32 that the main will not intersect a column. Of course, inserting a line through a column which might involve some drilling could damage the structure of the building. The computer adds in the main by storing the location and size to the appropriate memory means in block 33.

Figure 3:
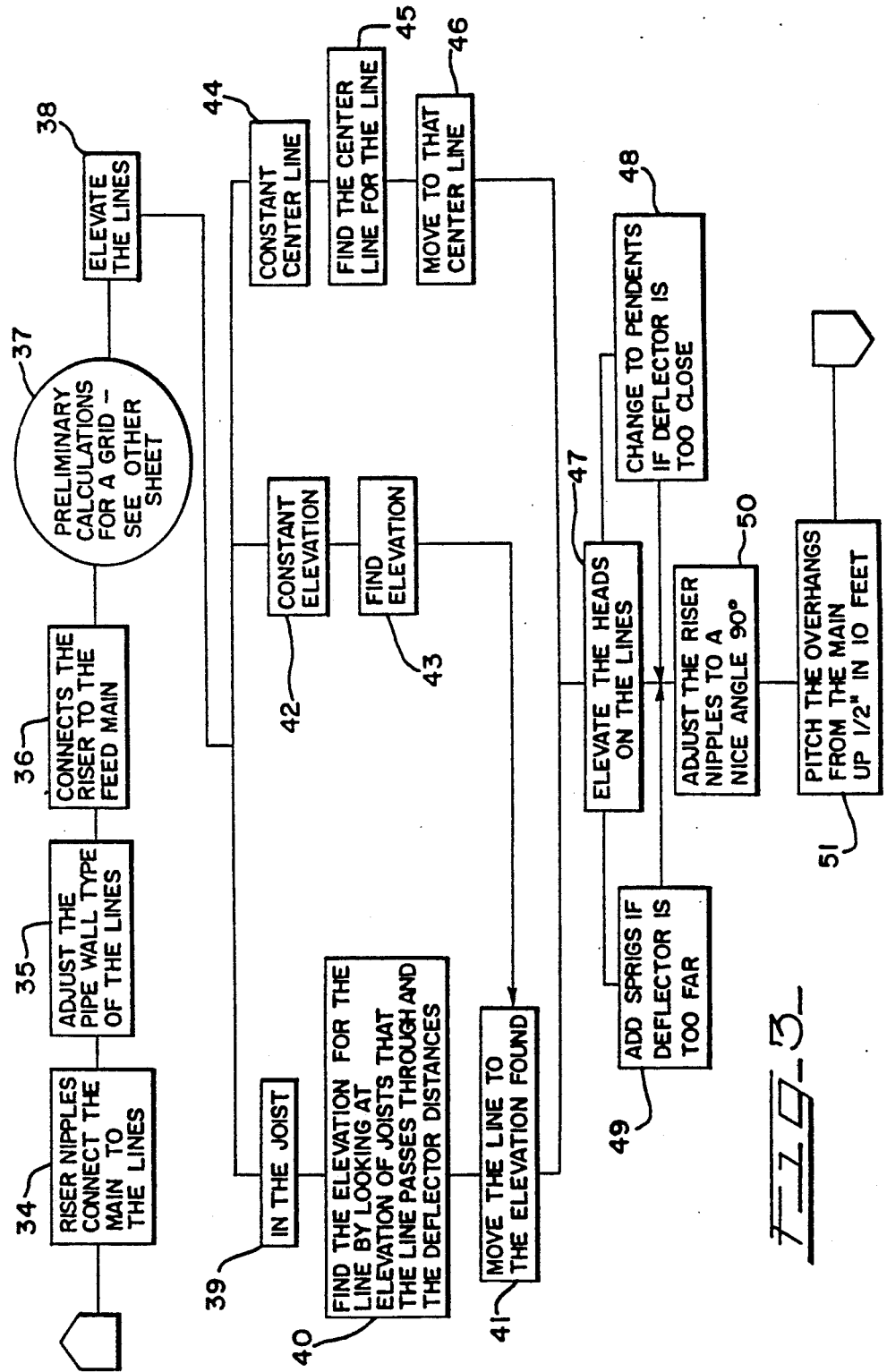

Turning now to FIG. 3, block 34, the computer electronically connects the mains to the lines via riser nipples. Riser nipples are piping which is set at ninety degree angles and comes out of the top side of the mains.

The program in block 35 adjusts the pipe wall type of lines which involves determining the wall thickness of the pipe for the lines. The computer lastly connects the mains and the riser to the mains to the water stub-in which was input in block 1.

The next step in the procedure is to elevate the lines. Prior discussion located the lines in a horizontal plane. This next analysis locates the lines in a vertical plane.

There are three alternative methods of elevating the lines. The first method is described in blocks 39-41 and located in the mains in the joists. The elevation of the lines is determined by looking at the elevation of the joists that the line passes through and the deflector distance of the heads. With exposed construction, the lines can then be moved to place the deflectors an appropriate amount of distance from the structure such as four inches (10 cm). As another alternative, the computer may locate the lines at a constant elevation and in blocks 42 and 43.

In the third and last methods, the computer may elevate the lines based on a center line. The center line is the distance from the top of the steel. The line is moved to place the deflector four inches (10 cm) from the top of the steel. This option is used in open warehouse environments without a drop ceiling.

In block 47, the computer elevates the heads on the lines. This is done by analyzing where the location of the deflector is compared to the top of the steel. If the deflector is too close to the top of the steel, the computer will change the head to a pendant type which hangs beneath the lines as opposed to the normal which is mounted above the line as shown in block 48. Alternatively, if the deflector is too far from the top of the steel, the computer will add sprigs to the head which mounts the head even further above the line than would be normal as shown in block 49.

Figure 4:
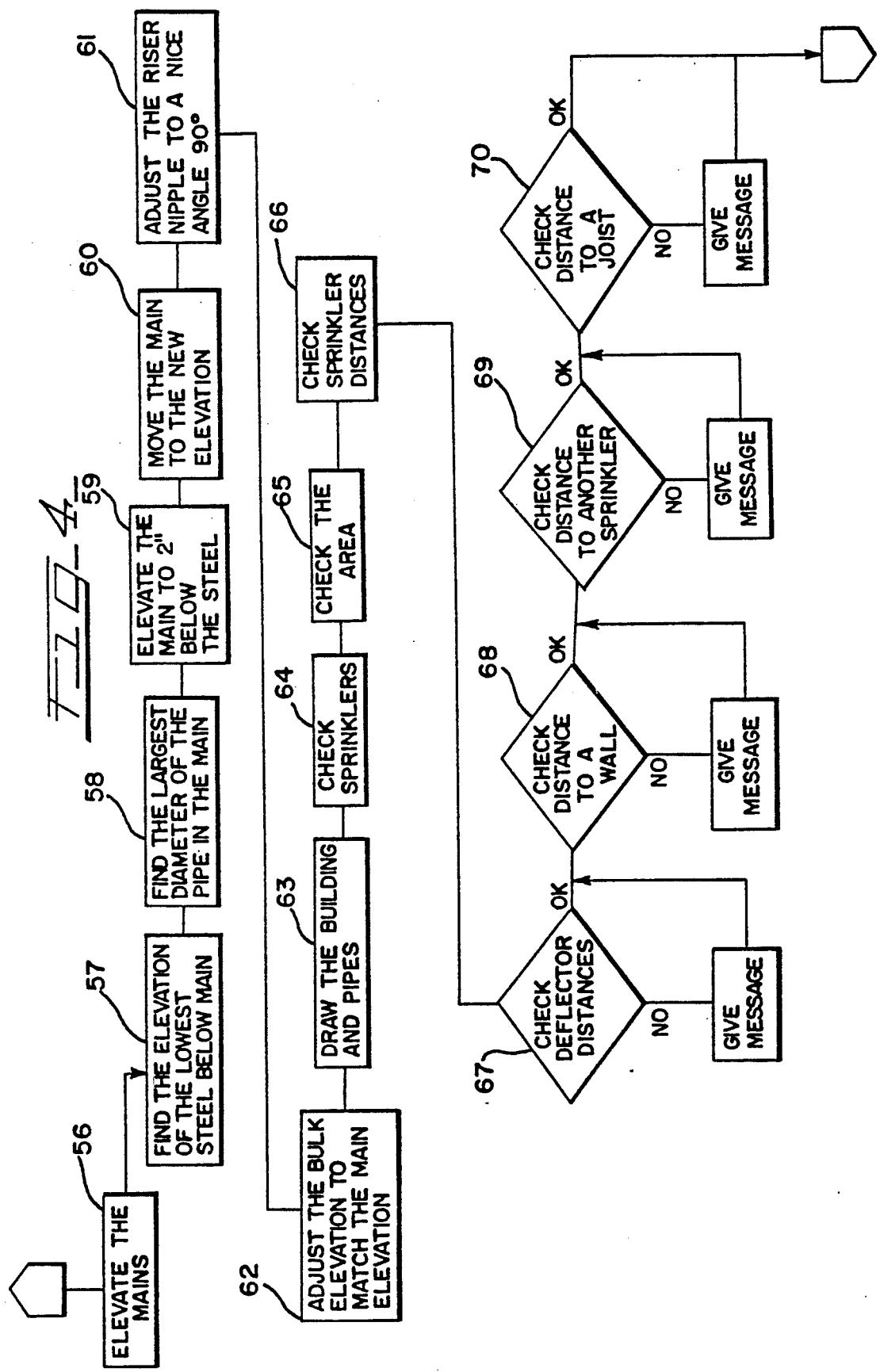

The computer as shown in block 50 adjusts the riser nipples to a ninety degree angle. In block 51, the computer pitches the part of the lines which overhang the mains to up to one-half inch in approximately ten feet. Turning now to FIG. 4, the computer's next task in blocks 56-62 is to elevate the mains themselves. First, the computer determines the elevation of the lowest intersecting steel below the main. The computer checks the joists and beam elevations input in block 1 and takes the lowest elevation.

In block 58, the computer finds the largest diameter of the pipe in the main and in block 59 simply elevates the main to two inches below the lowest steel found. The computer in block 60 moves the main to the new elevation. Again, the computer adjusts the riser nipple to get a ninety degree angle. The computer then adjusts the bulk elevation to match this main elevation.

In blocks 63-70 the computer performs a check of the system as located. The computer checks the heads and checks that the heads cover the areas they are designed to cover. These checks also include reviewing deflector distances to the top of the steel to see if it is located properly.

Next, the computer checks the distance to any walls in the vicinity and makes sure the distance from the head is correct. The computer checks the distance to nearby heads to be assured that the heads properly cover. Finally, the computer checks the distance to any nearby joists to be assured clearance is adequate. If a problem is discovered, a message is always given to the user.

Figure 5:
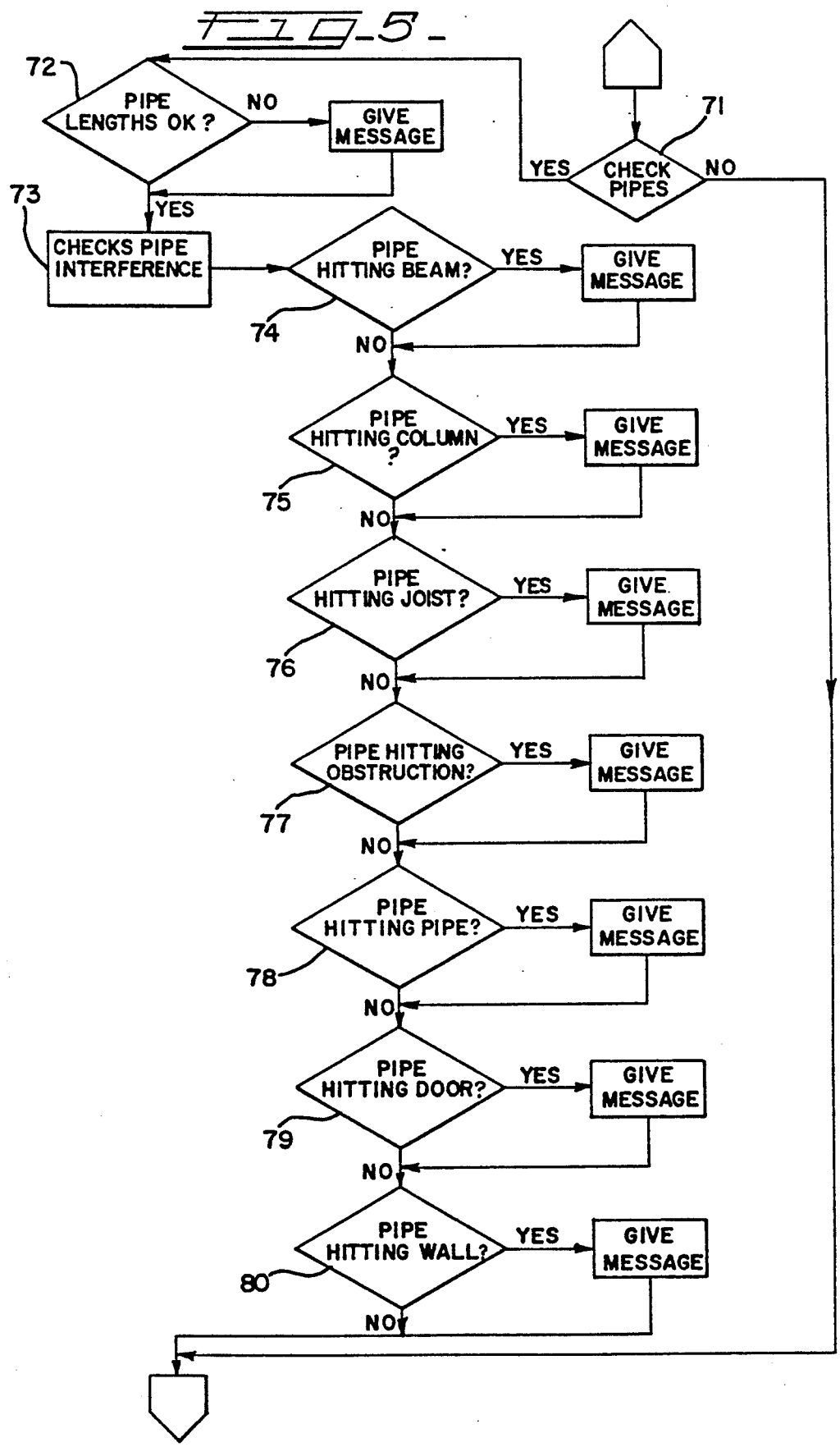

In FIG. 5, the systems checks continue in blocks 71 through 80. Now, the computer begins to look at the piping rather than the heads. The first check is to see whether the piping lengths are adequate. Then it begins to check whether the pipes avoid obstructions. First, the computer evaluates whether the piping intersects any beams, columns, joists or other obstructions found in the building. The computer also checks to see if the pipes are not intersecting with one another or impeded by any doors or walls which have been installed.

Figure 6:
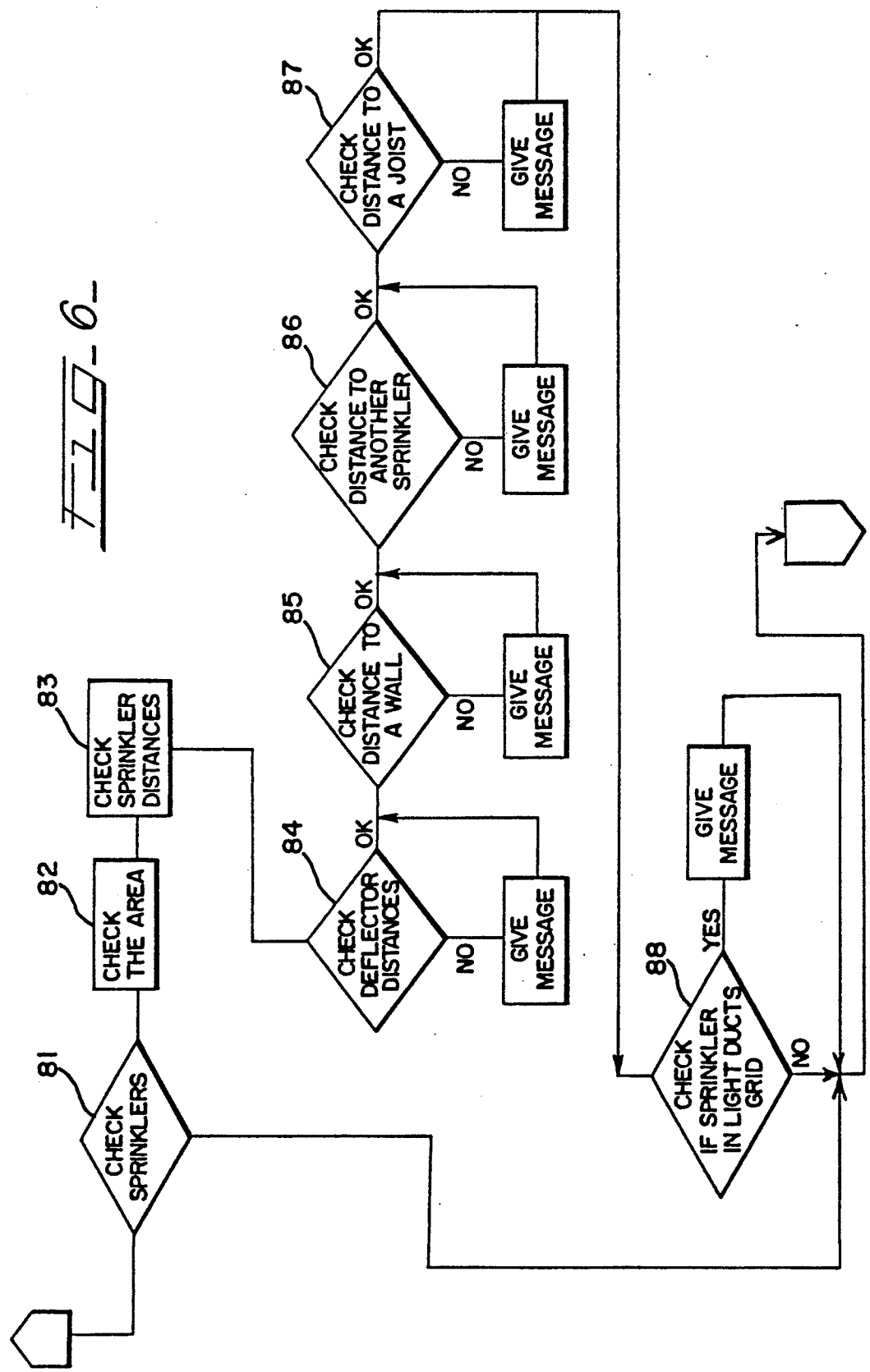

In FIG. 6, in blocks 81-88, there is a second check of the sprinklers to make sure that they are adequate. This check is very similar to the one described in FIG. 4. The only addition is in block 88 where the computer checks that the sprinkler head is not located in a light fixture.

In FIG. 7, blocks 89 through 101, the computer evaluates the hydraulics of the system to be assured that the computer designed system will provide adequate coverage in the event of a fire. The user selects which type of flow test it is going to be using. Those two main analytical methods are the Hardy Cross and the Newton-Raphson methods. These have been described in the earlier embodiment.

Lastly, FIGS. 8 and 9, show where the computer will actually print out and list all of the elements needed to complete the job.

In blocks 102-119, the computer now runs a check on the heads looking for unconnected piping or sprinklers. If it finds any unconnected heads, a message is given to the user. This can occur only if a user manually edited a system and ignored numerous messages.

In blocks 104-107, the computer now checks the fittings to be sure that the fittings will connect all pipes together. The computer checks the piping types and, it also checks to makes sure the number of pipes going into a particular fitting is adequate. For example, in a tee-fitting, the computer will check to be assured that three pipes are coming into a particular tee-fitting. The computer checks that the wall thickness in a fitting matches to the pipes and it also finally checks to make sure that the pipe angles match. If any of these tests show a problem, a message is given to the user.

The computer will check for drains in any trap pipes and will add them if needed. The computer will check the length of the pipes and the diameters of the pipes to be sure they are adequate and that the piping matches. Finally, it will check the type and number of hangers to be assured they are adequate to support the system. If necessary, the hangers will be added. Once all of these tests are done, the computer will list the job. It will first go on and list the pipe in block 120 with instructions as to how to make on the pipe fitting. In block 121, it will list the riser nipples needed. In block 122, it will list the sprigs needed for the system. It will list all the fittings and couplings necessary to put the system together. It will list all the nuts and bolts. It will list the heads and it will list the signs, bells and spare heads necessary for the system. Lastly, the number of hangers will be listed out.

The final step in block 130 is to draw the piping for the entire system. This drawing consists of a blueprint or other layout design show all or selected elements for a stock list for a particular system.

The major difference between the more detailed description shown in FIGS. 1-9 and the earlier summary description is the method in which the location of heads and lines are computed in the earlier system, the lines are located first and then the heads are added on to that particular system. In the detailed description described in FIGS. 1-9, a line is added followed by the heads for that particular line and then a subsequent line is added followed by the heads for that subsequent line and so on until all lines and heads are sited. In still a third embodiment, not described, is to locate all heads first and then connect these heads with lines. In all of these cases, the mathematics is roughly similar and anyone skilled in the art would be able to interchange such systems at will.

FIG. 10 illustrates a combined warehouse and office space having a sprinkler system designed by the present invention. The building elements which must be avoided can be seen as the beams 126, the columns 127, the joists 128, and the outside walls 130. The building adjuncts which must be avoided are structures such as the lighting fixtures 131, the interior walls 132 the HVAC duct work 133 and the Warehouse lighting fixtures 134. The designed sprinkler system begins at a water stub-in 135.

The water stub-in is connected via mains 136. The mains then connect to the individual lines 137 which, in turn, connect to the individual sprinklers 138.

The sprinkler system is relatively simple to design in the large open spaces of a warehouse.

The computer essentially starts near wall 140 and locates a line 137 as described above. The next line 137 is positioned at twice the distance first line 137 is from the wall. The same procedure of spacing is used to locate the sprinklers 138 positioned along each individual line 137. The lines are connected to the mains at positions 141. The lines 137 feed directly from the mains 136 which in turn feed directly from the water stub-in 135. The major structural elements or adjuncts which the sprinkler must avoid are the overhead lights 134, the joists 128 and the beams 126. However, these spaced in a predictable fashion and are relatively easy to avoid.

Contrast this with the office space 142. The interior walls 132 make positioning the sprinkler system much more difficult. There are other obstacles such as the HVAC system 133. This makes the computations much more difficult. For example, each individual closet space 143 will need its individual sprinkler and the supporting lines and mains. Free standing walls 132 also cause problems because they interrupt the straight lines and easy flow found in the warehouse 139. The sprinklers need to be interrupted and adjusted to fit into these particular areas. The present invention does these adjustments automatically.

A manual editing system can be included with the program. The editor will allow a user to alter the system as desired and will perform the checks described to prevent inadvertent standards violations. The user starts in the main menu where the editing desired is selected.

The user may elect to add pipes to the system. When a pipe is added, a default diameter and wall type is assumed. If the user is adding to an existing pipe, the diameter of the new pipe will be left the same as the diameter of the existing pipe. When a pipe is added, the database will then contain the length of the pipe, the diameter of the pipe, the wall type of the pipe, and the end-nodes of the pipe. End-nodes are the X, Y, and Z coordinates of the ends of the pipe in space.

The user is instructed to choose between adding of the pipe to an existing fitting or to an existing pipe. If he chooses to add to an existing fitting, one end of the new pipe is known exactly as it will be the X, Y and Z coordinates of that fitting. The user must then select the other end point of the pipe.

The user may also choose to add the new pipe to an existing pipe. In that case, the end point of the new pipe will be at the X or Y intersection selected by the user of the existing pipe, and the user will again have to choose the other end position of this new pipe. The choosing of the end position is done by giving a direction, forward, back, up, down, right or left. The computer will provide the user with one of those options. Of any of those options which are possible, the user must choose one and then give either a center-to-center distance or a cut length of the pipe.

The user may then continue adding pipes, starting with the end point of the last pipe just entered. The computer will prompt him with the possible directions: forward, back, right, left, up or down, in which he may continue adding the pipe.

The user may also delete pipes. When a pipe is deleted, the end points are left intact because they are generally attached to other pipes or other fittings. If the end point is not attached to anything else, such as a cap on the end of a pipe, the fitting and the pipe will be deleted. If, on the other hand, those fittings are on other pipes, the fittings will be changed to reflect the new condition. For instance, a tee will change to either a coupling or will be removed, assuming it can be removed. This will depend on the diameter of all types and spatial arrangement of the pipes on the other end of this fitting.

The computer also will check to be sure that the pipe can be deleted. There are cases when this is not a reasonable option. Further, the computer will give the user the option to reverse his decision. For instance, the user may have selected a pipe inadvertently or may have selected a pipe which was not the one the computer thought was selected.

When the pipe is deleted, other things are done, such as the updating of lines or renumbering of lines. For example, if a line is now cut by removing a pipe in the center, that line now becomes two separate line numbers.

The user may also choose to change the diameter of a pipe, the wall type, the length, or simply move the pipe.

The user may also change the diameter of a pipe. The user first selects the pipe and will be told what the current diameter the pipe is. The user will then select the diameter he desires. The program will change the diameter of the pipe and will also change the adjoining fittings. Further, if the wall type the user has desired will require a much more expensive fitting than what was previously there, he will be warned of this so that he may change it back or change to a different type of fitting.

The user may change the wall type. The user will select the pipe which he desires to change. He will be informed what the current wall type is and will be requested to enter a new wall type. The pipe wall will change and any fittings attached to this pipe will be changed. Some fittings cannot be used on certain wall types. If a much more expensive fitting is then required, the user will be warned.

The user may change the length of a pipe. The user is instructed to choose a fitting on the end of the pipe which is expected to be moved. He will then be requested to enter new length of the pipe. He may either enter a center-to-center distance or a cut length. It will of course check t be sure that this move is possible.

The user may move pipes. The user selects the pipe. The user will be informed which of six possible movement directions this pipe has available to it. The computer will then move the pipe and adjust any fittings which are required to be adjusted due to this move.

The user may join pipes together. The user selects any two pipes in the system. They are then joined by way of an expert intelligence routine to determine the proper route in joining these pipes. For instance, piping may not be left outside the building. If piping goes between two elevations, it is likely that a drain will be required. Also, all fittings must be at right angles. Further, the least expensive method of joining the pipes will be used.

The user may extend the length of the pipe beyond the current end-node. The user is requested to pick the pipe and specify the length of the extension. The computer will then check to make sure it is possible to extend this pipe and will then extend it. It will check, for instance, that the pipe is a free end, so it may be moved. It will check the movement does not go outside the building. It will also check that the pipe does not hit another pipe.

The program will also allow user to edit by adding fittings to the system. They may be added either to a pipe or to another fitting. The user is requested to choose either the pipe or the fitting and the list of possible fittings will be displayed which may be added to the pipe or the fitting. The user may choose to add a fitting to a pipe end. The computer will insert that fitting in the selected pipe at the selected location and will update the pipe data. The pipe will be split and new fittings and their X, Y and Z coordinates will be added to the database. The user may choose to add the fitting to another fitting. This will cause a change to existing fittings to accommodate the new added fitting. For instance, an elbow may be changed to a tee to allow the addition of a plug.

The user will be allowed to delete fittings. The user at this point will choose the fitting he wishes deleted. The computer will give the user relevant information on the selected fittings. The computer will check to see if it is possible to delete the selected fitting. For instance, a tee cannot be deleted because it will leave three pipes all ending at one point. However, a coupling or a plug or other such fittings can be deleted.

The user may joint two pipes which were previously separated by a coupling. For example, if the user deleted the plug on a tee joining two pipes that were parallel, the plug will be deleted and the tee will be changed to a coupling. But if the diameter and wall types of the two parallel pipes are the same, instead of being coupled, the tee will be eliminated entirely and the two pipes will be joined into one single pipe.

The user may change fittings. The user would simply select the fitting he wished changed. A list of all possible changes for any selected fitting will be displayed on the computer screen. The user will select from among these to make the change. Any changes that the user makes will cause the computer to update the system by changing pipes, joining pipes, moving end points, whatever is required. The user may joint fittings by selecting two fittings. The fittings are then joined if its reasonable to do so. The pipe joining routines require expert intelligence functions. For instance, fittings cannot be joined if the pipe joining them would go outside the building.

Fittings which are joined at different elevations may require a drain on the lower fitting, for instance, joining a main and a fitting on a main in a warehouse to a fitting in an office through a wall would require addition of a drain. The user may move fittings by selecting fittings to be moved. He has two options by which he may move fittings.

First, the user may move fittings by specifying the distance between fittings. The user states which fitting is to be moved and the pipe and specifies a new distance between fittings, either as a center to center length or as a cut length. The program will check to make sure the move is possible, that the new fitting does not go up the end of the pipe or through a wall and will then make that move and update the database.

The alternate method of moving fittings is to point to a fitting and tell the computer which direction and how far you wish the fitting to be moved. Again, the computer will check to make sure that this movement is possible, that the fitting will not go outside the building, off the end of the pipe or move perpendicular to a pipe.

The user may add sprinklers to the systems. The addition of a sprinkler requires a new fitting and the sprinkler itself. Also, the program will generally determine if the sprinkler should be an upright, pendent or sidewall type sprinkler.

The user may choose to add a sprinkler to a line or a main. If he does this, he will be requested to select the position of the head. If the head is near a line or a main, he will be asked if he wishes to have the head placed in the line or main or wishes to have an extension to this head.

The user may wish to add a sprinkler to an existing fitting. This is likely to be the case when the addition of sidewall heads are wanted. The computer will change the fitting, for instance, change it from an elbow to a tee, to accommodate the sprinkler head. The user will also be asked which direction the sprinkler is to point. The user is then asked which pipe the head is to be added to. The program will then determine the most expedient manner of placing an extension to the pipe. These routines are intelligence routines.

The program must adjust the temperature, size, type and elevation of the added head depending upon various parameters. One of these includes the initial default settings. Another will be the hydraulic hazard type this head is in. Still another will be the particular building structure. Another, the distance from the ceiling, and there are a number of others.

The user may delete sprinklers. The user will be requested to select the particular sprinkler to delete. Information on the sprinkler will be given to the user.

When a head is deleted, the program must adjust the piping. For instance, a tee the head is on will be deleted and the pipes will be joined assuming they are the same diameter and wall type. Furthermore, if the head is on the end of a run, not only will the head be deleted along with the fitting, but the pipe as well. It is possible to have the head on the end of a pipe which is on the end of a pipe which is on the end of a pipe and these pipes are only there to supply water to that head. In that case, all pipes supplying water to the head will be deleted.

User may change various parameters. The user simply selects the head and then chooses from various options. For example, user may change the size of a head. The user will select the head and will be told the current size. Any new size the user selects will be checked for reasonableness. The user will then be allowed to select any number of heads and have their sizes changed the same.

The user may also change the temperature at which a sprinkler head activates. He selects the head. The program will inform him of the head's current activation temperature and the user can enter in a new temperature from a range of options. The user will be allowed to change the activation temperature for any of a number of other heads.

The user may change the type of a head. The user may change it, for instance, from an upright to a pendent head. The user simply selects the head. The user will be told the current type of head and asked which new type to change it to. The program will also check to see if, for instance, sprigs or drops are required. For instance, changing a pendent head in an office to an upright head for the above warehouse, the computer would delete the drop and, if the line it is now on it too far from the ceiling of the warehouse, a sprig (a short extension) will be added. If the user changes to a sidewall, he will be asked the direction the sidewall is to point. The user may also add a head guard to a sprinkler. He simply selects the sprinkler and the head guard is added.

The user may move heads. There are two different ways of moving heads. First, a head may be moved in a direction. In this method, the user selects a head. The computer will tell him which direction is possible for the head to be moved. The user will choose from these options and give the actual distance to move.

Alternatively, the user may choose to move the head by a pipe length change. In this method, the user points the pipe near the head which is to be moved. The user then enters in the new length of this pipe, either in center to center or cut length. The user may add a hanger to any pipe desired. The user simply selects the pipe. When the user chooses the pipe, the program checks to see if the pipe needs a hanger. If the pipe does not need a hanger, the user is informed of this and the hanger is not added. If the pipe does indeed need a hanger, the program will check for the best location for the hanger. The program will attempt to hang it to a joist. If no joists are possible, it will hang to a beam. If there are several possible joist locations to hang to, the hanger will be placed on the joist furthest from the feed main.

The user may also add hangers at any point on a pipe. When a hanger is added, the program determines the distance from the pipe to the joist or beam it is hung from. It will add a ring to the pipe, a rod of the proper length attached to a top beam clamp at the top. The computer then chooses the closest possible hanger location to the user's point. It will attempt to hang to a joist or beam, or if none are nearby, it will use a trapeze hanger at that intersection point. The program also checks to be sure there is not already a hanger at that intersection point. This is easy to check if you are hanging to a joist or beam since this is a specific point at the intersection of the joist or beam with the pipe. However, if it is a trapeze hanger, then the program will check to see if there is hanger within a few feet of the selected location.

The program determines which particular type of hanger to add at a spot. For instance, if this is a simple intersection with a joist, it would add in a simple type "A" hanger. If, however, it is an intersection with a beam, the user may wish to use a top of beam hanger or we may wish to use a bottom of beam hanger. If there are no intersections, then obviously a trapeze hanger is desired.

The user may change a hanger to a different type. The program determines all possible hanger types that could be used at this particular location. These are displayed to the user. The user chooses the one desired and selects it. The hanger is then changed and the database is updated.

The user also may delete hangers. There are several options of method of deletion. The user may delete individual hangers by selecting the hanger he wishes to delete. The user may delete all hangers on any particular pipe he desires. The user may delete all hangers on any particular line he chooses. The user may also choose to delete all hangers in the system.

The user may add a line to the system. The user picks the starting point and the ending point and a line will be put in. The user has the option of whether to add heads to the line or not. If the user does choose to add heads to the line, the program will suggest head spacing for minimum pipe usage. The user may accept this spacing or select spacing as desired. The computer will put the heads on the lines at whichever spacing is chosen.

The computer will give the user options for the elevation of the line. He may elevate the line within the joists which is the most common way it is done or the user may put the line below the steel or the user may give any particular elevation he desires and the line will be placed there. Alternatively, the user may give the center of the line which is the distance of the line below the top of the steel rather than from above-grade as an elevation number.

The user may change a line. This would involve movement, elevation, wall types or diameter changes of the entire line or any part of a line. This would involve the updating of end, node, X, Y and Z coordinates, pipe diameters and pipe cut lengths.

User may change the entire line or elect to change part of line by selecting two points on the line and moving the pipes between these two points. The may select a point in the middle of a pipe on the line. This would involve the addition of new fittings at this point to connect the existing pipes and their locations with the changed pipe.

The user may add a main to the system. The addition of a main requires the user to state where the main is to be located. The computer will then determine the elevation of the main and add riser nipples between the main and any nearby line pipes.

The user may add a main across existing lines. In this case, he simply points to the pipe on one end of the main and a pipe on the line on the other end of the main. The main will be added between these two pipes. If he so desires, all pipes between line pipes that are near the main will have riser nipples added to join them to the new main.

The user may simply decide to add a main in an open area where there are no line pipes. In this case, the user selects either end of the main and the main will be added but it will not be joined to any pipes.

User may delete a main. He selects the main to be deleted. If there any overhanging lines on the deleted main, it is possible that their elevation has been changed to slope for draining into the main. If this is the case, the lines are straightened so that they are linear with the rest of the line before the main.

The user may change the main. There are several options for main changes. The user may elect to move the main. This involves selecting the main and the computer will then state which direction it can be moved. The user will pick one of the options and the user will give a distance to move it. This can be done for an entire main, in which case the user simply selects the main or the user can select to move only a part of the main. For partial movement, the user picks two points on the main. All pipes between these points will be moved.

The user may elevate the main or only a portion of the main. In this case, the user selects the main. He will be notified if the main is at a constant elevation or if it is sloped with the roof.

The user may also elevate the main by adjusting one of the end points on the main. He simply selects the end point to be moved and the computer will inform him of its current elevation. The user may then move this end point by a certain amount or specify a slope and the entire main will be adjusted by this slope.

The user may decide to change the wall type of the main. The user selects the line. The user will be informed what wall type it is now and may then choose another wall type. Similarly, the user may also change the diameter of a main, the entire main or main system. The user may elect to change only part of the main. This would by any pipes between two points chosen.

The user may elect to edit walls. The user may add a wall. The walls are added by selecting the point along an existing wall. The distance from this point to the nearest wall perpendicular to the chosen wall is given. The user then enters the correct inside to inside wall distance he wants the new wall to be at. He then selects a point perpendicular to this wall and will be then given the inside to inside length of this new wall. The user then enters the distance he desires.

The user may change a wall at any time. He may change the width or thickness of a wall by selecting the wall, its new width or thickness.

The user may move walls, a whole wall or delete or move part of a wall. To do this, the user selects either a corner or a point in the middle of a wall and then selects a second point and the wall between these two points will be deleted or moved. The user may elect to move an end point of a wall. The user may elect to add, change or move or delete doors on walls. The user may elect to split a wall. This will insert what could be called a corner anywhere in the wall. This would allow him to slide this corner. The user may edit lights in a ceiling grid, may edit ceilings in an office, may edit ducts in offices, may change the top of the steel, may edit beams, may edit joists, and add joists. He will point to a beam or wall or one of the joists and point to a beam or wall for the other end of the joist and the joist will be inserted.

The foregoing is illustrative of the principles of the invention. Further, since numerous modifications and changes will readily occur to those skilled in the art, it is not desired to limit the invention to the exact construction and operative shown and described. Accordingly, all suitable modifications and equivalents may be resorted to while still falling within the scope of the invention.

What is claimed is:

1. A method for designing a distribution system and producing a layout of the system for a building or a portion of a building, the method comprising in combination the steps of:

(a) storing, in digital form in first memory means, generic dimensional requirements of elements from which distribution systems can be constructed;
(b) storing, in digital form in second memory means, requirement of at least one building standard from which distribution systems can be evaluated;
(c) entering input data into a computer operatively connected to the first and second memory means, the input data including the location and dimensions of building elements and adjuncts of the building;
(d) identifying the requirements of at least one building standard stored in the second memory means to be used;
(e) dividing the building into a plurality of sections based on the input data; and
(f) electronically designing a layout from the distribution system in each section using the generic dimensional requirements of the elements stored in the first memory means, the layout being designed to comply with the requirements of the at least one building standard.

2. The method of claim 1 wherein the step of electronically designing the layout for the computer further comprises generating from the designed layout hard copy detailing the distribution system.

3. The method of claim 2 wherein the step of generating hard copy further comprises printing out an elements listing, the elements listing being printed out in the order the elements will be used.

4. The method of claim 1 further comprising the steps of manually editing the layout and electronically checking the edited layout for compliance with the requirements of the at least one building standard.

5. The method of claim 1 where the first and second memory means comprise a non-volatile memory system.

6. The method of claim 1 wherein the distribution system is a heating and air conditioning system.

7. The method of claim 1 wherein the building elements and adjuncts includes beams, columns, girders, floors, ceilings, electrical systems, phone lines and walls.

8. The method of claim 7 wherein the distribution system is a sprinkler system for fire prevention.

9. The method of claim 8 wherein the elements comprise piping components of the sprinkler system.

10. The method of claim 8 wherein the step of dividing the building into a plurality of sections further comprises first dividing the building into bays which are defined by the beams which are oriented horizontally whereby the bays define the sections.

11. The method of claim 8 wherein the step of dividing the building into sections further comprises dividing the building into rooms which are defined by the walls wherein the rooms define the sections.

12. The method of claim 1 wherein the step of electronically designing the layout further comprises performing an obstructions analysis to ensure the layout does not intersect with the building elements and adjuncts.

13. The method of claim 1 wherein the step of entering the input data further comprises choosing any one of the elements to be optimized.

14. The method of claim 1 wherein the distribution system is a sprinkler system for fire prevention, and the building elements and adjuncts include beams, columns, girders, floors, ceilings, electrical systems, phone lines and walls;

further wherein the step of electronically designing the layout for each section further comprises:

calculating the number of lines needed and the minimum distance between the lines in the section from the selected standard;

locating the lines in the section to avoid intersecting with building elements and adjuncts;

calculating the number of heads needed and the minimum distance between the heads to comply with the selected standard;

locating the heads on the lines to avoid intersecting with building elements and adjuncts;

calculating the number of mains needed to adequately supply the heads with water;

locating the mains in the section to avoid intersecting with building elements and adjuncts; and selecting proper fittings to connect the heads to the lines and the lines to the mains.

15. The method of claim 14 wherein the step of calculating the number of lines and the distance between the lines further comprises determining the orientation of the beams as the lines will be oriented parallel to the beam; dividing the width of the section by a distance between the lines given by the identified standard then rounding up to a whole number, whereby the whole number is equal to the number of lines; and dividing the whole number into the width of the section; whereby deriving a minimum distance between lines.

16. The method of claim 15 wherein the step of calculating the number of heads per line and the minimum distance between the heads further comprises multiplying the length of the section by the minimum distance between the lines and then dividing the result by the maximum area a head is to cover from the selected standard and rounding up to a whole number, whereby the whole number is equal to the number of heads and selecting a minimum distance between the heads which is the lesser of:

dividing the whole number into the length of the section;

dividing the maximum area of a head by the minimum distance between the lines; and a maximum distance between heads from the selected standard.

17. The method of claim 16 wherein the step of calculating the number of mains per line which is one if the number of heads per line is seven or less and two if greater than seven.

18. The method of claim 17 wherein the step of electronically designing the layout further comprises performing a hydraulic analysis of the layout to determine compliance with the selected standard.

19. The method of claim 14 wherein the step of locating the calculating number of lines in the section further comprises:

calculating the distance of a first line from the first lengthwise wall of the section by dividing the minimum distance by two;

locating the first line parallel to the first lengthwise wall at the calculated distance;

electronically checking the location of the first line to determine if it intersects the building elements and adjuncts whereby if the first line does intersect the structural element; the first line is relocated an incremental unit of distance further from the first lengthwise wall such that the total distance from the first lengthwise wall does not exceed the maximum distance, such relocation continuing until the first line does not intersect the building elements and adjuncts;

locating subsequent lines parallel to the first lengthwise wall and spaced the minimum distance from the preceding line; and electronically checking the location of the subsequent line to determine if it intersects the building elements and adjuncts whereby if the subsequent line does intersect the structural element the subsequent line is relocated an incremental unit of distance further from the preceding line such that the total distance from the preceding line does not exceed the maximum distance, such relocation continuing until the subsequent line does not intersect the building elements and adjuncts, the locating of the subsequent lines being continued until the calculated number of lines is positioned.

20. The method of claim 19 wherein the step of locating the calculated number of heads in the section further comprises:

calculating the distance of a head from a widthwise wall of the section by dividing the minimum distance between heads by two;

locating the first head of a line on the line at the calculated distance;

electronically checking the location of the first head to determine if the first head intersects the building elements and adjuncts whereby if the first head does intersect the structural element the first head is relocated an incremental unit of distance further from the widthwise wall such that the total distance from the widthwise wall does not exceed the maximum distance between heads, such relocation continuing until the first head does not intersect the building elements and adjuncts;

locating subsequent heads along the line spaced the minimum distance from a preceding head; and electronically checking the location of the subsequent head to determine if the subsequent head intersects the building elements and adjuncts whereby if the subsequent head does intersect the structural element the subsequent head is relocated an incremental unit of distance further from the preceding head such that the total distance from the preceding head does not exceed the maximum distance between heads, such relocation continuing until the subsequent head does not intersect the building elements and adjuncts, locating the subsequent heads continuing until the calculated number of heads is positioned.

21. The method of claim 20 wherein the step of locating the mains further comprises:

locating the mains perpendicular to the lines from a position located between the first line and the first lengthwise wall to a position located between the subsequent line corresponding to the calculated number of lines and the second lengthwise wall; and if only one main is used, dividing the number of heads by two and truncating to an integer value, the main being placed between the head corresponding to the integer value and the head corresponding to the integer value plus one as counted the first head;

if there are eight or nine heads, locating one main between the first head and the wall and locating the second main between the seventh and eighth heads as counted from the first head; and if there are ten or more heads, locating one main between the second and third head and locating the second main between the second to last and the third to last head as counted from the first head.

22. The method of claim 21 wherein the hydraulic analysis is a Newton-Raphson treatment.

23. The method of claim 21 wherein the hydraulic analysis is a Hardy-Cross treatment.

24. The method of claim 21 wherein performing a hydraulic analysis further comprises selecting the head furthest from the main, calculating the hydraulic pressure at the furthest head and evaluating whether the calculated pressure is adequate to allow the head to function properly.

25. An apparatus for designing a distribution system and producing a layout of the system for a building or a portion of a building, the apparatus comprising:
(a) first memory means for storing in digital form generic dimensional requirements of elements from which the distribution system can be constructed;
(b) second memory means for storing in digital form requirements of at least one building standard from which the distribution system can be evaluated;
(c) means for entering input data into a computer operatively connected to the first and second memory means, the input data including the location and dimensions of building elements and adjuncts of the building;
means for identifying the requirement of at least one building standard stored in the second memory means to be used;
(e) means for dividing the building into a plurality of sections based on the input data; and
(f) means for electronically designing a layout for the distribution system in each section to comply with the selected building standard.

26. The apparatus of claim 25 wherein the means for electronically designing the layout for the computer further comprises means for generating from the designed layout hard copy detailing the distribution system.

27. The apparatus of claim 26 wherein means for generating hard copy further comprises means for printing out an elements listing, the elements listing printed out in the order the elements will be used.

28. The apparatus of claim 25 further comprising means for manually editing the layout and electronically checking the edited layout for compliance with the requirements of at least one building standard.

29. The apparatus of claim 25 wherein the first and second memory means comprises a non-volatile memory system.

30. The apparatus of claim 25 wherein the distribution system is a heating and air conditioning system.

31. The apparatus of claim 25 wherein the building elements and adjuncts include beams, columns, girders, floors, ceilings, electrical systems, phone lines and walls.

32. The apparatus of claim 31 wherein the distribution system is a sprinkler system for fire prevention.

33. The apparatus of claim 32 wherein the elements comprise piping components for the sprinkler system.

34. The apparatus of claim 33 wherein the means for dividing the building into a plurality of sections further comprises means for dividing the building into bays which are defined by the beams which are oriented horizontally whereby the bays define the sections.

35. The apparatus of claim 33 wherein the means for dividing the building into sections further comprises means for dividing the building into room which are defined by the walls wherein the rooms define the sections.

36. The apparatus of claim 35 wherein the means for electronically designing the layout for each section further comprises:
means for calculating the number of lines needed and the minimum distance between the lines in the section from the selected standard;
means for locating the lines in the section to avoid intersecting with building elements and adjuncts;
means for calculating the number of heads needed and the minimum distance between the heads to comply with the selected standard;
means for locating the heads on the lines to avoid intersecting with building elements and adjuncts;
means for calculating the number of mains needed to adequately supply the heads with water;
means for locating the mains in the section to aovid intersecting with building elements and adjuncts; and
means for selecting proper fittings to connect the heads to the lines and the lines to the mains.

37. The apparatus of claim 36 herein means for calculating the number of lines and the distance between the lines further comprises means for determining the orientation of the beams as the lines will be oriented parallel to the beams, means for dividing the width of the section by a distance between the lines given by the identified standard then rounding up to a whole number, whereby the whole number is equal to the number of lines; and means for dividing the whole number into the width of the section, whereby deriving a minimum distance between lines.

38. The apparatus of claim 37 wherein means for locating the calculated number of lines in the section by further comprises:
means for calculating the distance of a first line from the first lengthwise wall of the section by dividing the minimum distance by two;
means for locating the first line parallel to the first lengthwise wall at the calculated distance;
means for electronically checking the location of the first line to determine if it intersects the building elements and adjuncts whereby if the first line does intersect the structural element the first line is relocated an incremental unit of distance further from the first lengthwise wall such that the total distance from the first lengthwise wall does not exceed the maximum distance, such relocation continuing until the first line does not intersect the building elements and adjuncts; the
means for locating of subsequent lines being parallel to the first lengthwise wall and spaced the minimum distance from a preceding line; and
means for electronically checking the location of the subsequent line to determine if it intersects the building elements and adjuncts whereby if the subsequent line does intersect the structural element the subsequent line is relocated an incremental unit of distance further from the preceding line such that the total distance from the preceding line does not exceed the maximum distance, such relocation continuing until the subsequent line does not intersect the building elements and adjuncts, the locating of the subsequent lines being continued until the calculated number of lines is positioned.

39. The apparatus of claim 38 wherein the means for calculating the number of heads per line and the minimum distance between the heads further comprises means for multiplying the length of the section by the minimum distance between the lines and then dividing the result by the maximum area a head is to cover from the selected standard and rounding up to a whole number, whereby the whole number is equal to the number of heads and selecting a minimum distance between the heads which is the lesser of:
  dividing the whole number into the length of the section;
  dividing the maximum area of a head by the minimum distance between the lines; and
  a maximum distance between heads from the selected standard.

40. The apparatus of claim 39 wherein the means for locating the calculated number of heads in the section further comprises:
  means for calculating the distance of a head from a widthwise wall of the section by dividing the minimum distance between heads by two;
  means for locating the first head of a line of the line at the calculated distance;
  means for electronically checking the location of the first head to determine if the first head from the first head intersects the building elements and adjuncts whereby if the first head does not intersect the structural element the first head is relocated an incremental unit of distance further from the widthwise wall such that the total distance from the widthwise wall does not exceed the maximum distance between heads, such relocation continuing until the first head does not intersect the building elements and adjuncts;
  means for locating subsequent heads along the lines spaced the minimum distance from a preceding head; and
  means for electronically checking the location of the subsequent head to determine if the subsequent head intersects the building elements and adjuncts whereby if the subsequent head does intersect the structural element the subsequent head is related an incremental unit of distance further from the preceding head such that the total distance from the preceding head does not exceed the maximum distance between heads, such relocation continuing until the subsequent head does not intersect the building elements and adjuncts, locating the subsequent heads continuing until the calculated number of heads is positioned.

41. The apparatus of claim 40 wherein the number of mains per line is one of the number of heads per line is sever or less and two is greater than seven.

42. The method of claim 41 wherein the means for locating the mains further comprises:
  means for locating the mains perpendicular to the lines from a position located between the first line and the first lengthwise wall to a position located between the subsequent line corresponding to the calculated number of lines and the second lengthwise wall; and
  if only one main is used, dividing the number of heads by two and truncating to an integer value, the main being placed between the head corresponding to the integer value and the head corresponding to the integer value plus one as counted the first head;
  if there are eight or nine heads, locating one main between the first head and the wall and locating the second main between the seventh and eighth heads as counted from the first head; and
  if there are ten or more heads, locating one main between the second and third head and locating the second main between the second to last and the third to last head as counted from the first head.

43. The apparatus of claim 42 wherein the means for electronically designing the layout further comprises means for performing a hydraulic analysis for the layout to determine compliance with the selected standard.

44. The apparatus of claim 43 wherein the hydraulic analysis is a Newton-Raphson treatment.

45. The apparatus of claim 43 wherein the hydraulic analysis is a Hardy-Cross treatment.

46. The apparatus of claim 43 wherein the means for performing a hydraulic analysis comprises means for selecting the head furthest from the main and means for calculating the hydraulic pressure at the furthest head and means for evaluating whether the calculated pressure is adequate to allow the head to function properly.

47. The apparatus of claim 25 wherein means for electronically designing the layout further comprises means for performing an obstruction analysis to ensure the layout does not intersect with the building elements and adjuncts.

48. The apparatus of claim 25 wherein means for entering the input data further comprises means for choosing any of the elements to be optimized.

* * * * *

UNITED STATES PATENT AND TRADEMARK OFFICE
CERTIFICATE OF CORRECTION

PATENT NO. : 5,227,983

DATED : July 13, 1993

INVENTOR(S) : Gene M. Cox, Charles L. Hines, III and Linda M. Normann

It is certified that error appears in the above-identified patent and that said Letters Patent is hereby corrected as shown below:

Column 13, line 2, change "check t be sure" to --check to be sure--.

Column 13, line 24, change "buildinq" to --building--.

Column 14, line 60, delete "which is on the end of a pipe".

Column 15, line 18, change "on it too" to --on is too--.

Column 16, line 40, change "The may select" to --They may select--.

Column 16, line 62, after "there" insert --is--.

Column 18, Claim 1, line 5, change "requirement" to --requirements--.

Column 18, Claim 1, line 17, change "from" to --for--.

Column 18, Claim 7, line 41, change "includes" to --include--.

Column 18, Claim 10, line 49, delete "a plurality of".

Column 19, Claim 15, line 25, change "beam" to --beams--.

Column 19, Claim 19, line 56, change "calculating" to --calculated--.

Column 21, Claim 25, line 31, change "means" to --(d) means--.

Column 21, Claim 29, line 54, change "comprises" to --comprise--.

Column 21, Claim 34, line 66, change "for" to --of--.

Column 22, Claim 35, line 5, change "room" to -rooms--.

UNITED STATES PATENT AND TRADEMARK OFFICE
CERTIFICATE OF CORRECTION

PATENT NO. : 5,227,983
DATED : July 13, 1993
INVENTOR(S) : Gene M. Cox, Charles L. Hines, III and Linda M. Normann It is certified that error appears in the above-identified patent and that said Letters Patent is hereby corrected as shown below:

Column 22, Claim 36, line 23, change "aovid" to --avoid--.

Column 23, Claim 40, line 26, change "a line of" to --a line on--.

Column 23, Claim 40, line 31, delete "not".

Column 23, Claim 40, line 46, change "related" to --relocated--.

Column 24, Claim 41, line 5, change "of" to --if--.

Column 24, Claim 41, line 6, change "sever" to --seven--.

Column 24, Claim 41, line 6, change "is" to --if--.

Column 24, Claim 43, line 31, change "analysis for" to --analysis of--.

Signed and Sealed this

Thirty-first Day of May, 1994

*Attest:*

BRUCE LEHMAN

*Attesting Officer*   Commissioner of Patents and Trademarks